United States Patent

Kondo et al.

[11] Patent Number: 5,448,452
[45] Date of Patent: Sep. 5, 1995

[54] CIRCUIT BOARD FOR MOUNTING A BAND-PASS FILTER

[75] Inventors: Hisashi Kondo, Tokyo; Tomoshi Sone, Shizuoka, both of Japan

[73] Assignee: NEC Corporation, Tokyo, Japan

[21] Appl. No.: 77,766

[22] Filed: Jun. 18, 1993

[30] Foreign Application Priority Data

Jun. 18, 1992 [JP] Japan .................................. 4-159683

[51] Int. Cl.⁶ ............................................. H05K 7/02
[52] U.S. Cl. ...................................... 361/760; 361/761; 361/777; 361/743; 174/260; 174/262; 174/263
[58] Field of Search ............... 361/736, 752, 760, 761, 361/728–730, 733–734, 743; 174/262, 263, 250, 254–261; 29/832, 837, 845; 257/690–697; 360/762–764, 777

[56] References Cited

U.S. PATENT DOCUMENTS

| | | | |
|---|---|---|---|
| 3,991,347 | 11/1976 | Hollyday | 361/760 |
| 4,553,114 | 11/1985 | English et al. | 361/760 |
| 4,908,586 | 3/1990 | Kling et al. | 361/760 |
| 5,036,301 | 7/1991 | Takao et al. | 361/760 |

FOREIGN PATENT DOCUMENTS 0130410  1/1985  European Pat. Off. .

Primary Examiner—Bot LeDynh
Attorney, Agent, or Firm—Sughrue, Mion, Zinn, Macpeak & Seas

[57] ABSTRACT

A circuit board for mounting a band-pass filter. An elongate through hole is formed through the ground surface of the circuit board for shielding the input and output terminals of a band-pass filter from each other. The through hole eliminates unexpected coupling between the input and output terminals within the circuit board. Solder which flows into the through hole allows the casing of the filter to closely contact the ground surface of the circuit board.

2 Claims, 4 Drawing Sheets

CIRCUIT BOARD FOR MOUNTING A BAND-PASS FILTER

BACKGROUND OF THE INVENTION

The present invention relates to a circuit board for mounting a band-pass filter and, more particularly, to the land configuration of the area of a circuit board where a band-pass filter is to be located.

A band-pass filter is extensively used with, for example, a mobile radio communication apparatus since it has a strict electric characteristic and is highly resistive to environments, small size, and light weight. Generally, a band-pass filter has a casing made of metal or similar conductive material and accommodating major circuitry therein, and an input terminal, an output terminal and a ground terminal extending out from the bottom of the casing. The input, output and ground terminals are respectively soldered to an input line, an output line and a ground surface provided on a circuit board. This configuration, however, has a drawback that unexpected coupling is apt to occur between the input and output terminals of the filter, preventing a desired frequency band characteristic or similar electric characteristic from being achieved. To eliminate such coupling, it is a common practice to locate a shield between the input and output terminals on the circuit board. It has been reported that assuming specifications prescribing an attenuation at an image frequency, i.e., a simple characteristic of greater than 56 dB, the attenuation achievable with the shield is 56.0 dB at an image frequency of f0(21.7 MHz)−910 kHz, which is higher than 40.0 dB available with a circuit board lacking the shield.

However, the unexpected coupling between the input and output terminals also occurs within the circuit board, and this cannot be coped with by the shield. Moreover, since the casing of the filter is connected to the ground surface of the circuit board only at the ground terminal thereof, an impedance exists between the casing and the ground surface. This impedance is likely to degrade the desired electric characteristic of the filter.

SUMMARY OF THE INVENTION

It is therefore an object of the present invention to provide a circuit board which eliminates undesirable coupling between the input and output terminals of a band-pass filter within the circuit board and allows the casing of the filter to closely contact the ground surface thereof.

In accordance with the present invention, a circuit board for mounting a band-pass filter having a casing and an input terminal, an output terminal and a ground terminal affixed to said casing, the ground terminal intervening between the input and output terminals comprises a ground surface, an input line and an output line to which the input terminal and the output terminal of the band-pass filter respectively are to be connected, and a through hole formed through the ground surface and intervening between the input and output terminals of the band-pass filter connected to the input and output lines, respectively.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1A:
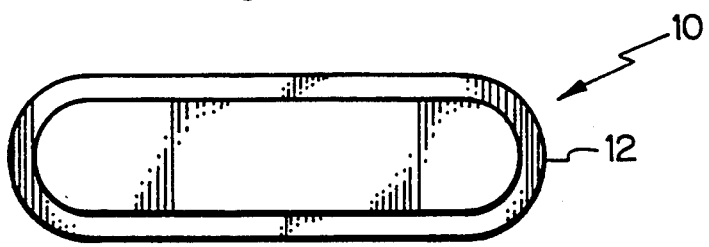
FIGS. 1A, 1B, 1C and 1D show a conventional band-pass filter in a plan view, a front view, a bottom view, and a side elevation, respectively.
Figure 1B:
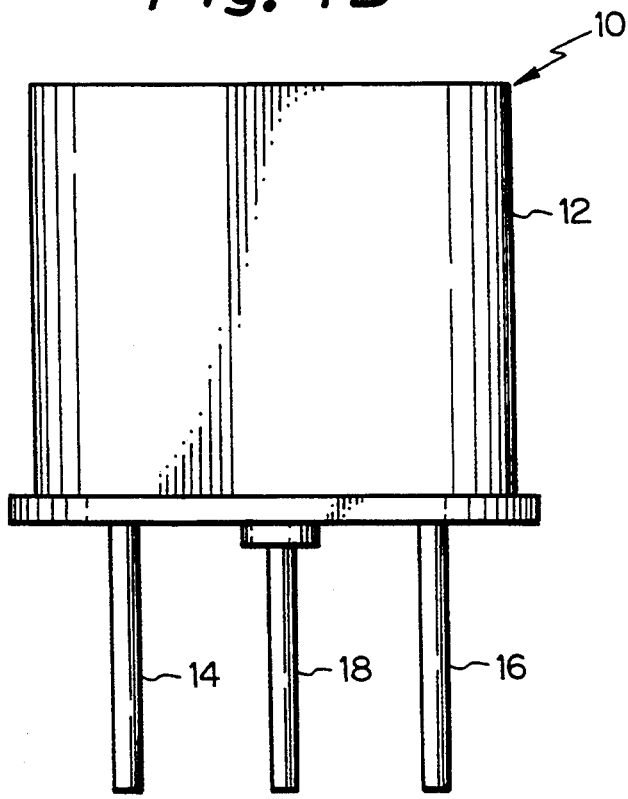
Figure 1D:
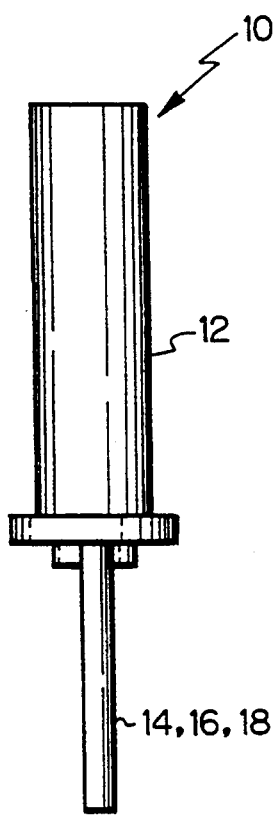
Figure 1C:
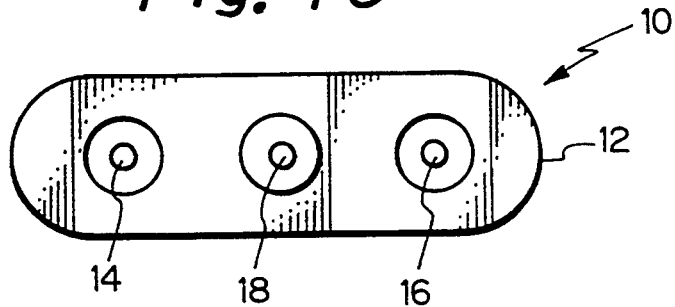

To better understand the present invention, a brief reference will be made to a conventional band-pass filter, shown in FIGS. 1A, 1B, 1C and 1D. As shown, the band-pass filter, generally 10, has a casing 12 made of metal or similar conductive material and accommodating major circuitry therein. An input terminal 14, an output terminal 16 and a ground terminal 18 extend out from the bottom of the casing 12.

Figure 2A:
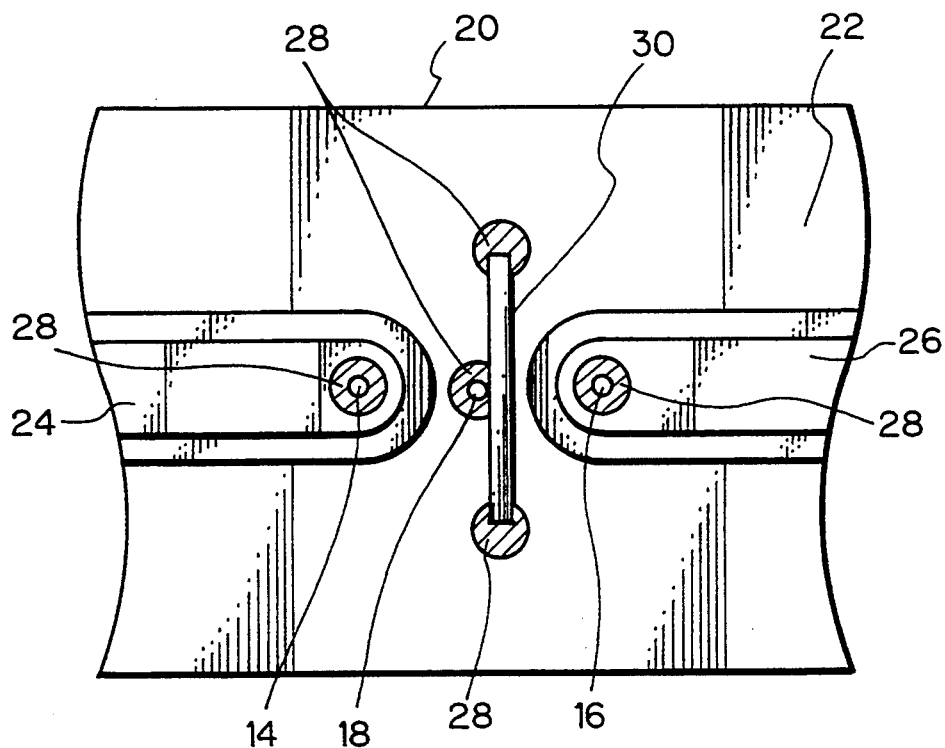
FIGS. 2A and 2B are respectively a bottom view and a side elevation showing the conventional filter mounted on a circuit board.
Figure 2B:
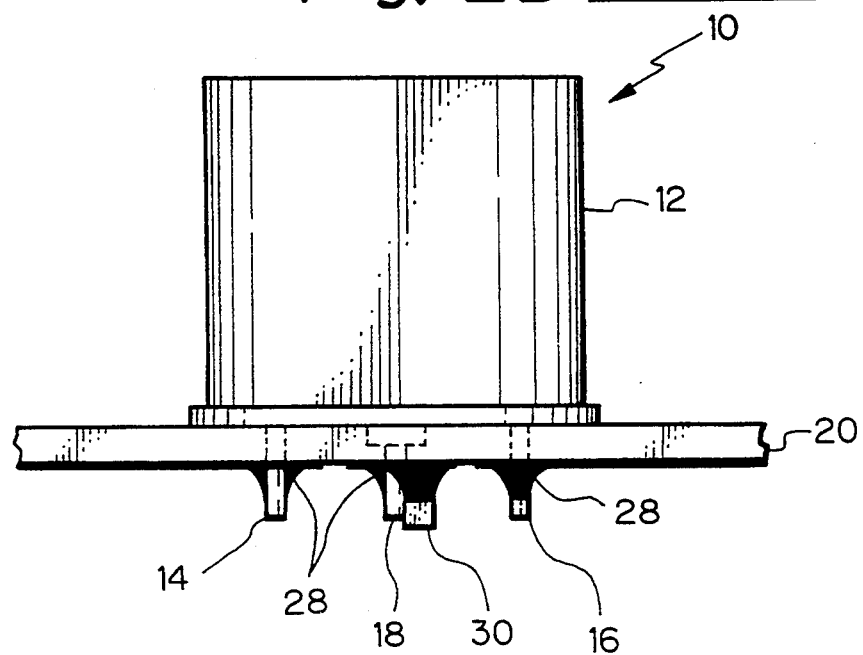

FIGS. 2A and 2B show the band-pass filter 10 mounted on a circuit board 20. As shown, the circuit board 20 has a ground surface 22. An input line 24 and an output line 26 are provided on the circuit board 20 at a position where the filter 10 is to be located. To affix the filter 10 to the circuit board 20, the input terminal 14, output terminal 16 and ground terminal 18 of the filter 10 are respectively connected to the input line 24, output line 26 and ground surface 22 of the circuit board 20 by solder 28. The problem with this kind of configuration is that unexpected coupling is apt to occur between the input terminal 14 and the output terminal 16 of the filter 10, preventing a desired frequency band characteristic or similar electric characteristic from being achieved. In the light of this, it has been customary to locate a shield 30 between the input terminal 14 and the output terminal 16 on the circuit board 20 and connect it to the board 20 by solder 28. It has been reported that assuming specifications prescribing an attenuation at an image frequency, i.e., a simple characteristic of greater than 56 dB, the shield 30 realizes an attenuation of 56.0 dB at an image frequency of f0(21.7 MHz)−910 kHz, which is contrastive to 40.0 dB particular to a case without the shield 30.

However, since the unexpected coupling between the input terminal 14 and the output terminal 16 also occurs within the circuit board 20, the shield 30 is not a satisfactory measure. Moreover, since the casing 12 of the filter 10 is connected to the ground surface 22 of the circuit board 20 only at the ground terminal 18 thereof, an impedance exists between the casing 12 and the ground surface 22. This impedance is likely to degrade the desired electric characteristic of the filter 10.

Referring to FIGS. 3A, 3B, 4A and 4B, a circuit board embodying the present invention and applicable to a band-pass filter will be described. In the figures, the same constituents as the constituents shown in FIGS. 1A–1D, 2A and 2B are designated by the same reference numerals, and a detailed description will not be made to avoid redundancy.

Figure 3A:
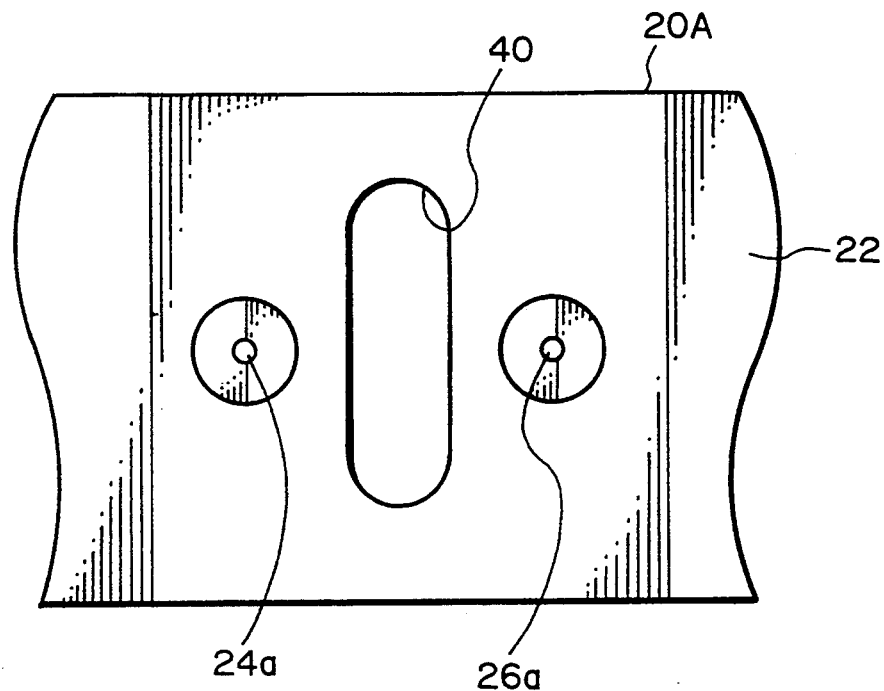
FIGS. 3A and 3B are respectively a plan view and a rear view of a circuit board embodying the present invention and applicable to a band-pass filter.
Figure 3B:
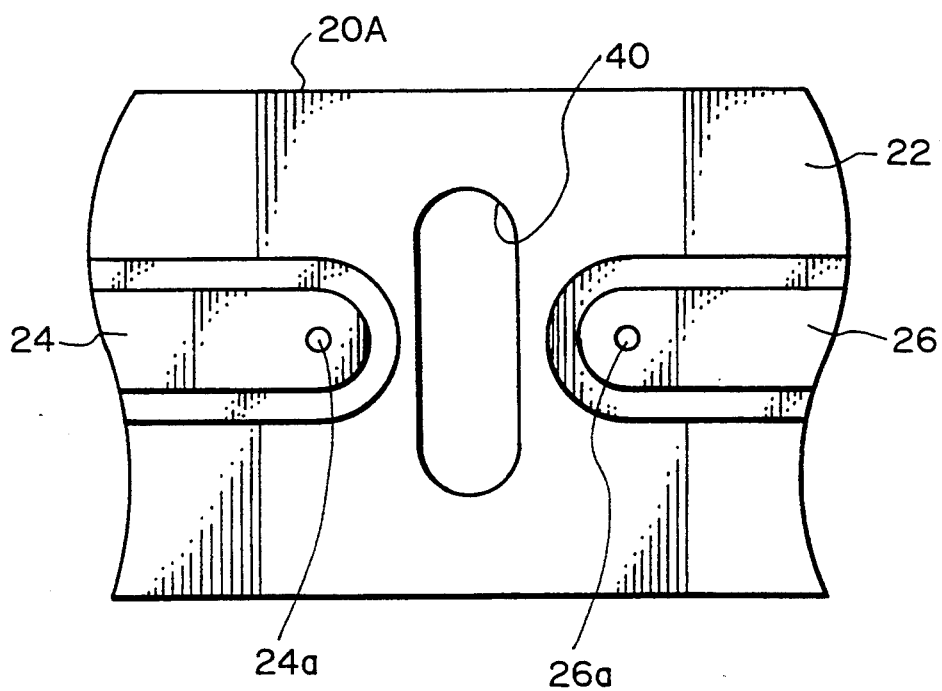

FIGS. 3A and 3B show a circuit board 20A embodying the present invention in a plan view and a bottom view, respectively. As shown, the circuit board 20A has a ground surface 22. Holes 24a and 26a are formed through the circuit board 20A for receiving an input terminal 14 and an output terminal 16 extending out from a band-pass filter 10, respectively. An input line 24 and an output line 26 are provided on the rear of the circuit board 20A so as to be soldered to the terminals 14 and 16, respectively. In the illustrative embodiment, an elongate through hole 40 is formed through the ground surface 22 of the circuit board 20A and perpendicularly traverses an imaginary line connecting the input terminal 14 and output terminal 16.

Figure 4A:
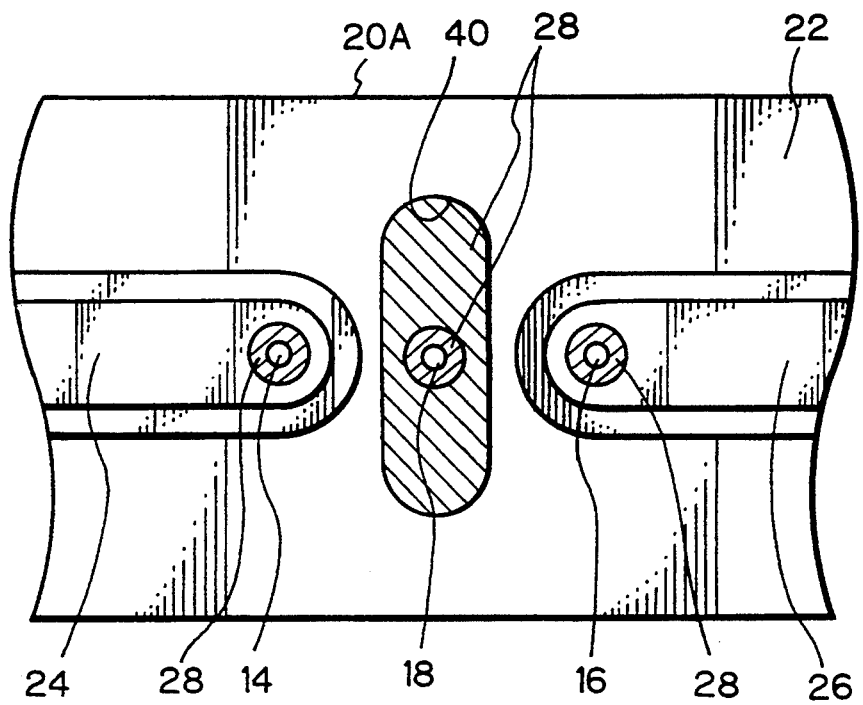
FIGS. 4A and 4B are respectively a bottom view and a side elevation showing the embodiment on which a band-pass filter is mounted.
Figure 4B:
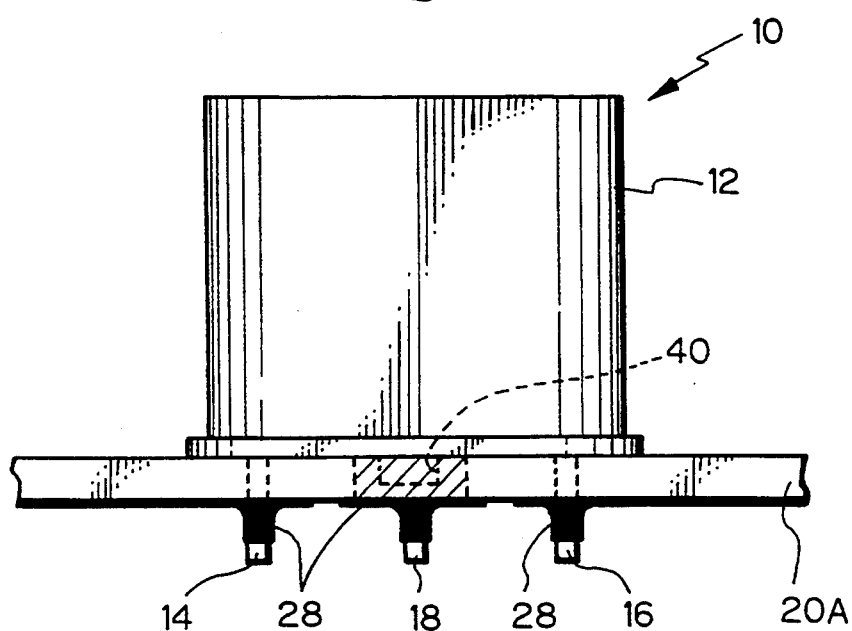

The band-pass filter 10 is mounted on the circuit board 24A, as shown in FIGS. 4A and 4B in a bottom view and a side elevation, respectively. As shown, the input terminal 14 and the output terminal 16 of the filter 10 are respectively connected to the input line 24 and the output line 26 of the circuit board 20A by solder 28. A ground terminal 18 also extending out from the filter 10 is passed through the through hole 40 and affixed to the circuit board 20A by solder 28. Specifically, the solder 28 flows into and stops up the through hole 40, as indicated by hatching in the figures. This is successful in further enhancing the shield effect between the input terminal 14 and the output terminal 16 within the circuit board 20A. In addition, the solder 28 flown into the through hole 40 in a great amount allows the casing 12 of the filter 10 to closely contact the ground surface 22 of the circuit board 20A, so that the impedance between the casing 12 and the ground surface 22 is noticeably reduced.

Experiments showed that assuming specifications of the filter 10 prescribing an attenuation at an image frequency, i.e., a simple characteristic of greater than 56 dB, the circuit board 24A realizes an attenuation of 62.0 dB at an image frequency of f0(21.7 MHz)−910 kHz. In this respect, the through hole 40 constitutes a remarkable improvement over the conventional shield 30.

In summary, a circuit board embodying the present invention prevents undesirable coupling from occurring between the input and output terminals of a band-pass filter within the board without resorting to the modification of a conventional band-pass filter. This, coupled with the fact that the casing of the filter closely contacts the ground surface of the circuit board, makes the most of the electric characteristic particular to the filter.

Various modifications will become possible for those skilled in the art after receiving the teachings of the present disclosure without departing from the scope thereof.

What is claimed is:

1. A circuit board for mounting a band-pass filter having a casing and an input terminal, an output terminal and a ground terminal affixed to said casing, said ground terminal intervening between said input terminal and said output terminal, said circuit board comprising:

a ground surface;

an input line and an output line to which the input terminal and the output terminal of the band-pass filter respectively are to be connected; and a through hole formed through said ground surface and intervening between the input terminal and the output terminal of the band-pass filter connected to said input line and said output line, respectively, wherein said through hole is elongate and perpendicularly traverses an imaginary line connecting the input terminal and the output terminal of the band-pass filter mounted on said circuit board.

2. A circuit board for mounting a band-pass filter having a casing and an input terminal, an output terminal and a ground terminal affixed to said casing, said ground terminal intervening between said input terminal and said output terminal, said circuit board comprising:

a ground surface;

an input line and an output line to which the input terminal and the output terminal of the band-pass filter respectively are to be connected; and a through hole formed through said ground surface and intervening between the input terminal and the output terminal of the band-pass filter connected to said input line and said output line, respectively;

wherein the ground terminal extending out from the band-pass filter is passed through the through hole and affixed to the circuit board; and wherein said through hole is elongate and perpendicularly traverses an imaginary line connecting the input terminal and the output terminal of the band-pass filter mounted on said circuit board.

* * * * *